(12) United States Patent  
Groenenborn et al.

(10) Patent No.: US 9,147,996 B2  
(45) Date of Patent: Sep. 29, 2015

(54) LASER MODULE FOR HOMOGENEOUS LINE-SHAPED INTENSITY PROFILES

(71) Applicant: KONINKLIJKE PHILIPS N.V., Eindhoven (NL)

(72) Inventors: Stephan Groenenborn, Aachen (DE); Jens Pollmann-Retsch, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/408,521

(22) PCT Filed: Jun. 26, 2013

(86) PCT No.: PCT/IB2013/055241  
§ 371 (c)(1),  
(2) Date: Dec. 16, 2014

(87) PCT Pub. No.: WO2014/002024  
PCT Pub. Date: Jan. 3, 2014

(65) Prior Publication Data  
US 2015/0155685 A1    Jun. 4, 2015

Related U.S. Application Data

(60) Provisional application No. 61/664,218, filed on Jun. 26, 2012.

(51) Int. Cl.  
*H01S 5/00* (2006.01)  
*H01S 5/026* (2006.01)  
*H01S 5/42* (2006.01)

(52) U.S. Cl.  
CPC ............. *H01S 5/026* (2013.01); *H01S 5/426* (2013.01)

(58) Field of Classification Search  
USPC .......... 372/43.01, 50.1, 50.11, 50.12, 50.121  
See application file for complete search history.

(56) References Cited

U.S. PATENT DOCUMENTS 5,477,259 A * 12/1995 Iwasa ............................ 347/238  
6,084,848 A 7/2000 Goto  
(Continued)

FOREIGN PATENT DOCUMENTS

JP 2003255251 * 9/2003  
WO 2011021140 A2 2/2011

OTHER PUBLICATIONS

Moench, Holger et al "Modular VCSEL Solution for Uniform Line Illumination in the kW Range", High Power Diode Laser Technology and Applications, vol. 8241, No. 1, Feb. 2012, pp. 82410B1-82410B12.

*Primary Examiner* — Dung Nguyen

(57) ABSTRACT

The present invention relates to a laser module comprising several sub-modules (1) arranged side by side along a first axis (10) on a common carrier. Each of said sub-modules (1) comprises a laser area (8) formed of one or several arrays of semiconductor lasers arranged on a surface of the sub-module (1). Laser radiation emitted by each of said semiconductor lasers (2) forms an intensity distribution in a working plane facing said surface of the sub-modules (1). The sub-modules (1) and laser areas (8) are designed and arranged such that the laser areas (8) of adjacent sub-modules (1) partly overlap in a direction perpendicular to said first axis (10). With such a laser module a thin laser line focus can be generated having a homogeneous intensity distribution along the length of the laser line independent on the distance between the module and the working plane. The individual semiconductor lasers (2) may be VCSEL with a rectangularly shaped emission.

9 Claims, 3 Drawing Sheets

(56) References Cited

U.S. PATENT DOCUMENTS

| | | |
|---|---|---|
| 6,421,159 B1 | 7/2002 | Sutter |
| 2002/0129723 A1 | 9/2002 | Beier |
| 2004/0046860 A1 | 3/2004 | Beier |
| 2009/0059255 A1 | 3/2009 | Ohide |
| 2011/0102537 A1 | 5/2011 | Griffin |

* cited by examiner

LASER MODULE FOR HOMOGENEOUS LINE-SHAPED INTENSITY PROFILES

CROSS-REFERENCE TO PRIOR APPLICATIONS

This application is the U.S. National Phase application under 35 U.S.C. §371 of International Application No. PCT/IB2013/055241, filed on Jun. 26, 2013, which claims the benefit of U.S. Provisional Patent Application No. 61/664,218, filed on Jun. 26, 2012. These applications are hereby incorporated by reference herein.

FIELD OF THE INVENTION

The present invention relates to a laser module comprising several sub-modules arranged side by side on a common carrier, each of said sub-modules comprising a laser area formed of one or several arrays of semiconductor lasers.

In many existing and upcoming application fields, heating with semiconductor lasers is a topic of growing interest. Some applications require homogeneous line-shaped intensity profiles, meaning top-hat rectangular profiles with a high ratio of the side lengths. One example is the drying of ink in a professional printing machine, requiring a laser line of up to 1.1 m length and only some millimeter width. Other application fields are the heating of metal or plastics, epilation, skin treatment or drying of glue and paint in production.

BACKGROUND OF THE INVENTION

When using a laser-heating line for printing, ink drying, roll to roll manufacturing processes or other applications the object to be heated at the surface passes below the heating line in a direction perpendicular to the line direction. Alternatively, the heating line is moved in the direction perpendicular to the line direction relative to the object. In order to generate a laser line of sufficiently high laser power with semiconductor lasers it is necessary to arrange several sub-modules carrying arrays of surface emitting semiconductor lasers side by side on a common carrier. The emission of the single semiconductor lasers is then focused by an appropriate lens system, in particular a cylindrical lens to the desired line shape on the working plane. With such a module problems arise due to the unavoidable gap between the individual sub-modules which results in several intensity minima along the laser line. To avoid or reduce such intensity minima WO2011/21140 A2 proposes a special design of the optics for focusing the laser radiation onto the working plane which overlaps the intensity distributions of adjacent sub-modules along the laser line. Optical gaps between two sub-modules can then be closed for certain distances between the module and the working plane.

SUMMARY OF THE INVENTION

It is an object of the present invention to provide a laser module comprising several sub-modules which allows a generation of a laser line having a homogeneous intensity distribution along the line without the need of specially designed optics.

The object is achieved with the laser module according to claim 1. Advantageous embodiments of the laser module are subject matter of the dependent claims or are described in the subsequent portions of the description.

The proposed laser module comprises several sub-modules arranged along a first axis side by side on a common carrier. Each of the sub-modules comprises a laser area formed of one or several arrays of semiconductor lasers arranged on a surface of the sub-module. The laser radiation emitted by said semiconductor lasers forms an intensity distribution in a working plane facing said surface of the sub-modules. The laser area may be identical with the surface area of the surface of the sub-modules or may also be smaller than this surface area. The sub-modules and laser areas are designed and arranged such that the laser areas of adjacent sub-modules partly overlap in a direction perpendicular to the first axis.

In a preferable embodiment the laser areas are formed of an arrangement of the arrays of semiconductor lasers, which comprises two parallel side edges. The parallel side edges of the laser areas of adjacent sub-modules are parallel to one another and tilted by an angle $\beta$ to said first axis, wherein $0°<\beta<90°$. Typically, the laser areas and also the surfaces of the sub-modules have a rectangular shape but also other shapes having two parallel side edges are possible, for example a trapezoidal geometrical design.

The intensity distribution generated with such a module preferably has an elongated form, for example a rectangular form with a larger length than width in the working plane. In a preferable embodiment, the intensity profile has a line-shaped form. Such a line shaped intensity profile requires an appropriate optics between the semiconductor lasers and the working plane in order to focus the emitted laser radiation in the direction perpendicular to the laser line to the desired line width. The direction of the longer side of the intensity profile in the working plane is parallel to the first axis along which the sub-modules are arranged on the carrier. The carrier may be any structure on which the sub-modules can be mounted, e.g. a plate or a frame.

The sub-modules are arranged in the above embodiment with the parallel side edges of the laser areas parallel to one another on the carrier. In contrast to the known perpendicular arrangement of these side edges to the first axis, the sub-modules are arranged in the proposed module with the side edges of their laser areas at an angle larger than 0° and smaller than 90° to the first axis. The angle is selected dependent on the distance between the parallel side edges of the surfaces of adjacent sub-modules or between the laser areas of adjacent sub-modules such that the intensity variations of the intensity profile in the working plane in a direction parallel to said first axis are reduced with respect to a 0° or 90° arrangement.

Due to this rotation of the sub-module surfaces or laser areas around their optical axis the homogeneity of the generated intensity profile is improved in the direction parallel to the first axis, in particular in the direction of the length of the intensity profile, in particular in case of a laser line. By selecting an appropriate angle of rotation at a given distance between the laser areas of the sub-modules the intensity minima in the working plane caused by the gaps between the sub-modules or laser areas can be perfectly removed independent of the distance of the working plane from the laser module. This is independent of any optics used in front of the lasers in order to collimate and/or focus the laser emission to a desired shape. The proposed design does not require any specialized optics in order to achieve the above effect and thus allows using optical arrangements which are simple to manufacture. The same applies to the design of the semiconductor lasers in the laser array which may be, for example, circular or rectangular shaped VCSELs (VCSEL: vertical cavity surface emitting laser) or VECSELs (VECSEL: vertical extended cavity surface emitting laser). The same advantage is achieved in case of other designs and arrangements of the sub-modules and laser areas such that the laser areas of adjacent sub-modules partly overlap in a direction perpendicular to the first axis. The sub-modules and laser areas may e.g. also have a triangular form to this end.

The design and arrangement of the sub-modules and laser areas is preferably selected such that—except of the border areas of the laser module—the laser power of the laser radiation emitted by the semiconductor lasers when integrated in the direction perpendicular to the first axis coincides within an accuracy of ±10% for each portion of the first axis. The size of this portion of the first axis, along which the above integrated intensity is summed up or integrated, is of course larger than the distance between adjacent semiconductor lasers but smaller than the gap between adjacent laser areas. The lower limitation of the size of this portion of the first axis is necessary since the mutual distance between the individual lasers causes an intensity variation on a small scale in the plane of the laser module along this axis. With such design of the laser module intensity variations along a generated laser line which normally occur due to the gaps between adjacent laser areas or sub-modules, are completely avoided.

In a preferred embodiment of the proposed laser module the individual semiconductor lasers are arranged in a quadratic grid arrangement with sides parallel to the side edges of the laser areas and have rectangular or square shaped emission areas, wherein the edges of the square shaped or rectangular emission areas are oriented at an angle of 45° to the parallel side edges of the laser areas. Alternatively, the edges of the square shaped or rectangular emission areas are oriented parallel to the sides of the quadratic grid arrangement and the quadratic grid arrangement is oriented at an angle of 45° to the parallel side edges of the laser areas. The parallel side edges of the laser areas are in both cases arranged at an angle of 45° to said first axis such that the edges of the square shaped or rectangular emission areas of the lasers are parallel to the first axis and to the direction of the longer side of the intensity profile in the working plane.

In another advantageous embodiment each laser array comprises the lasers in a hexagonal arrangement oriented with the main axes at an angle of 30° or 60° to said side edges of the surfaces of the sub-modules. In this embodiment the sub-modules are arranged at an angle of 30° or 60° to said first axis. Both embodiments have the advantage of a substantially conventional layout of the laser arrays which then can be combined, if necessary, with conventional micro lens arrays or a single large cylindrical lens for collimation. Cylindrical micro lenses can be used in such a case forming rows and columns of lenses which do not have to be rotated relative to the direction of the longer side of the intensity profile, in particular laser line, or first axis. The same applies when using a single large cylindrical lens.

The term sub-module in the present patent application relates to any unit carrying one or several arrays of semiconductor lasers. Depending on the construction or size of the module, such a sub-module can be formed of a sub-mount on which several semiconductor laser chips or chips carrying small arrays of semiconductor laser are mounted. Such a unit or sub-module can also be formed of micro-coolers on which several of the above sub-mounts or on which several chips with semiconductor lasers or arrays of semiconductor lasers are mounted.

In a preferred embodiment of rectangular laser areas the tilt angle, i.e. the angle between the first axis and the straight parallel edges of the laser areas, is selected according to the following condition: $H \times \cos \beta = n \times (B+G)/\sin \beta$ with n being any integer number, $\beta$ being the tilt angle, B being the width of the laser areas between the two parallel side edges, H being the length of the rectangular laser areas and G being the size of the gap between the laser areas of the sub-modules, i.e. the gap between the opposing side edges of adjacent sub-module surfaces—or between adjacent laser areas, if the width B of the laser areas is smaller than the width of the sub-module surface. With this condition, the intensity minima along the generated laser line or elongated laser intensity distribution resulting from the gaps between the sub-modules or laser areas can be completely avoided. The homogeneity achieved with the proposed arrangement does not depend on the distance of the working plane from the module anymore.

The proposed laser module can be used for any application in which an elongated laser intensity profile in a working plane is needed which has a high homogenity along the direction of the longest elongation. The proposed laser module allows the generation of a laser line with a high length and small width by arranging a sufficiently high number of sub-modules along the first axis on the carrier. With such a laser module applications like drying of ink in a professional printing machine, heating of metal or plastics, epilation, skin treatment or drying of glue and paint in production, as already described in the introductory portion of the description, is possible. Nevertheless the laser module is also suitable for any other applications in which such a homogeneous intensity profile is required.

BRIEF DESCRIPTION OF THE DRAWINGS

The proposed laser module is described in the following by way of examples in connection with the accompanying figures without limiting the scope of protection as defined by the claims. The figures show:

FIG. 4 a diagram showing a further example of a design of the lasers and laser arrays of the tilted sub-module of FIG. 3a.

DETAILED DESCRIPTION OF EMBODIMENTS

Figure 1:
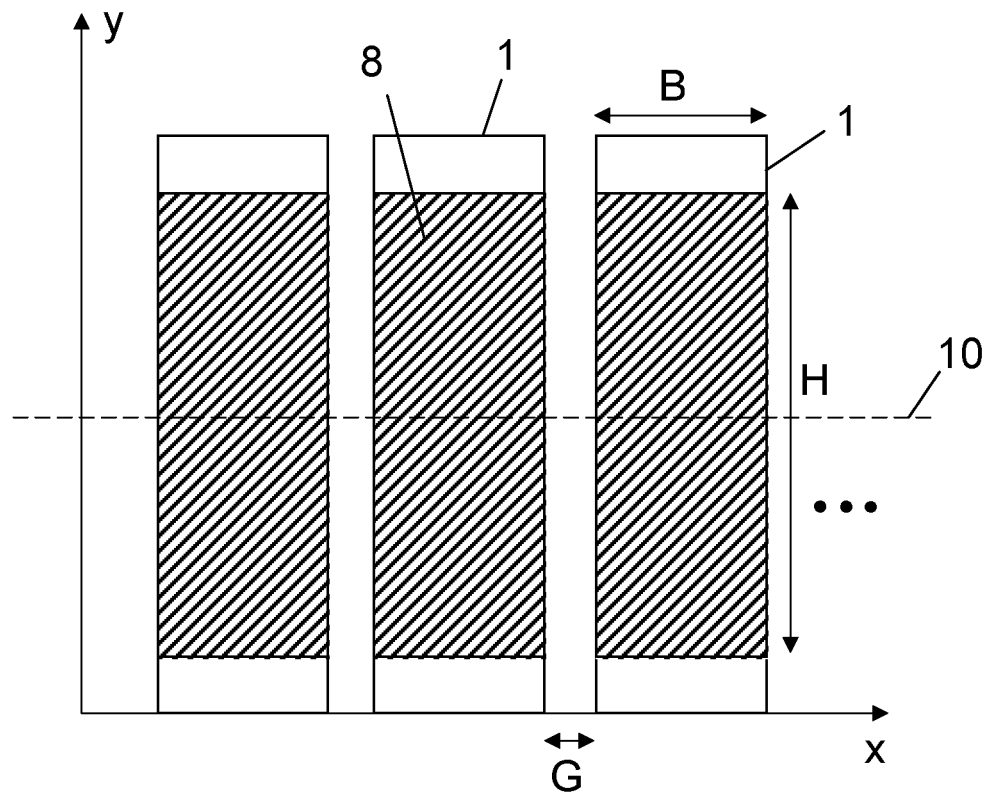
FIG. 1 an example of the arrangement of sub-modules of a laser module according to prior art.
Figure 1:
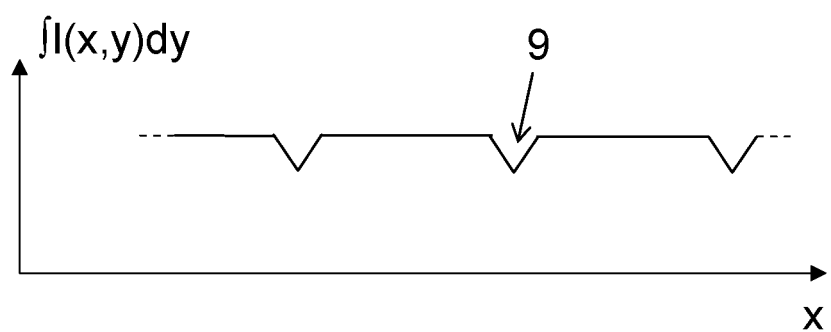

FIG. 1 shows the arrangement of sub-modules 1 in a laser module of the prior art in a schematic view. The complete module is built from a higher number of sub-modules having laser areas 8 with a length H (in y-direction) and width B (in x-direction). The sub-modules 1 are arranged along on a first axis 10. The y-direction is the direction in which the object to be heated or illuminated is moved with respect to the laser module or vice versa. The laser line, which is generated with the laser module on the object, i.e. in the working plane, extends in the x-direction. The laser areas 8 of the sub-modules 1 are formed from arrays of semiconductor lasers, in particular VCSEL chips with small arrays of VCSELs. When mounting the sub-modules 1 on a common carrier a gap having a gap width G is usually unavoidable between neighboring sub-modules 1 because of electrical connections, assembly tolerances, safety requirements, and other reasons.

When using such a laser module to generate the desired laser line or laser intensity distribution in the working plane the integrated intensity distribution $\int I(x, y) dy$ varies in x-direction. This is shown in the lower portion of FIG. 1, assuming a laser emission of the individual lasers which is not perfectly collimated. The minima 9 or inhomogeneities in the intensity distribution are caused by the gaps between the laser areas 8 or sub-modules 1, respectively.

Figure 2:
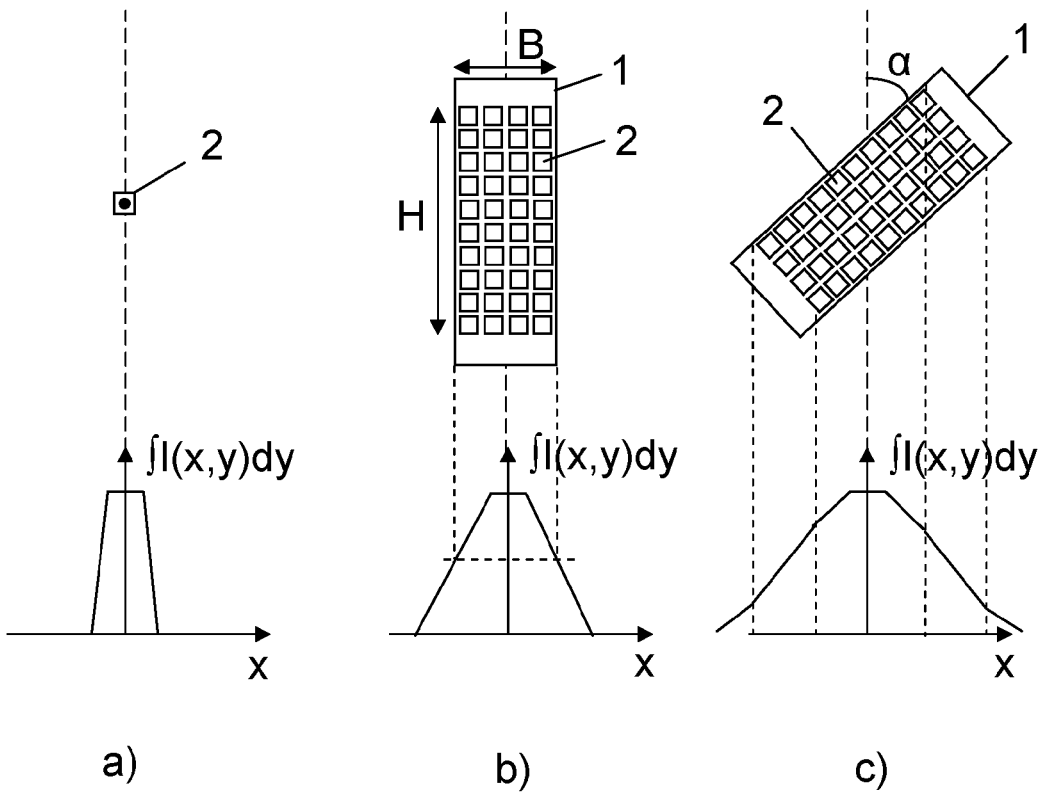
FIG. 2 a diagram showing integrated intensity profiles of a single laser array, a sub-module and a tilted sub-module when moving in y-direction over an object.

FIG. 2 shows three diagrams depicting this integrated intensity distribution for a single laser or for a single chip 2 carrying a small array of lasers (FIG. 2*a*), for a single sub-module 1 (FIG. 2*b*) and for a tilted sub-module for sub-module surface according to the present invention (FIG. 2*c*). As shown in this figure, the tilting of the sub-module surface by an angle cc smears out the integrated intensity distribution in x-direction. Also in this figure, the laser emission of the individual lasers is assumed to be not perfectly collimated. The integration takes into account the fast movement of the irradiated object in y-direction. This tilting of the sub-module 1 reduces the modulation depth of the total integrated intensity profile integral $\int I\,(x,y)\,dy$.

The present invention takes advantage of this effect and arranges the sub-module surfaces or whole sub-modules 1 at an angle $\alpha \neq 0°$ and $\alpha \neq 90°$ with their parallel side edges to the moving direction (y-direction) in the laser module. Since the sub-modules 1 are arranged along the first axis 10 parallel to the x-direction in this laser module, this means that the sub-modules 1 are arranged with the parallel side edges of their surfaces at an angle $\beta = 90° - \alpha$ to the first axis 10. This tilt angle is selected such that the laser areas 8 of adjacent sub-modules 1 partially overlap with respect to the y-direction as viewing direction.

In order to achieve a thin line focus (small dimension in the y-direction) it is often needed that the radiation of the individual semiconductor lasers is collimated in the y-direction by e.g. a cylindrical micro lens array. The radiation of the full module may also be focused down to the desired line widths with an appropriate cylindrical lens. Therefore the array arrangement of the semiconductor lasers on the semiconductor chip—in case of non-rotational symmetric VCSEL shapes, also the orientation of the individual VCSELs—and the orientation of the cylindrical micro lenses in front of the VCSELs needs to be tilted by the same angle $\beta$ with respect to the y-axis.

Figure 3:
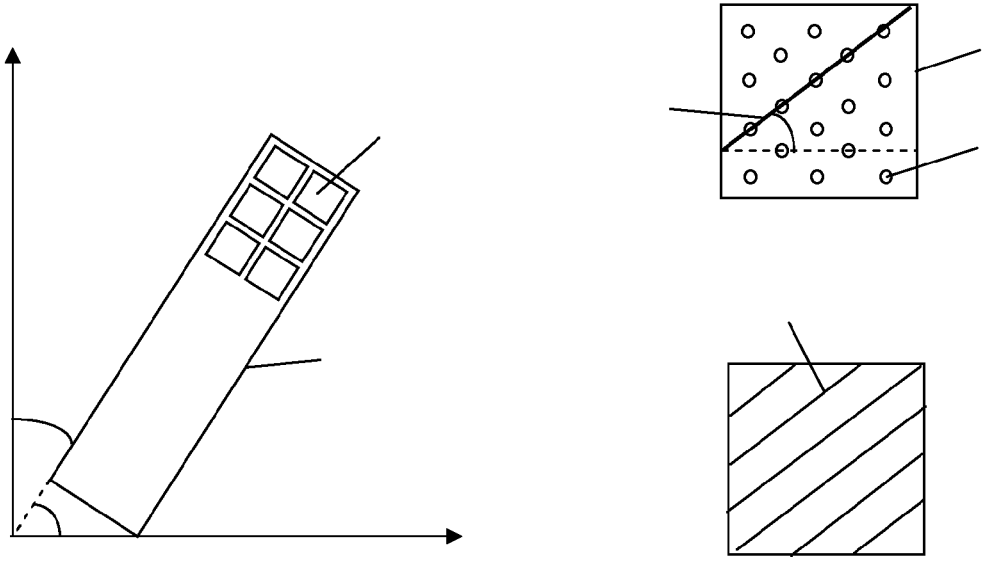
FIG. 3 a diagram showing a tilted sub-module and a corresponding design of the lasers and laser arrays of the sub-module.
Figure 4:
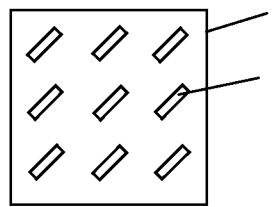

For some special tilt angles, the VCSEL layout can be more conventional as shown in FIGS. 3 and 4. FIG. 3*a* shows a sub-module 1 which surface is tilted by the angle $\beta$ against the x-direction. The VCSEL array chips 4 with an attached micro lens array are schematically indicated in the figure. In a preferred embodiment, the tilt angle $\beta$ is 30° or 60° for a VCSEL array with a hexagonal arrangement with one of the main axes 6 of the hexagonal arrangement being at an angle of 30° or 60° to one of the chip edges and on the mounted sub-module 1 parallel to the x-direction. This is indicated in FIG. 3*b* which shows a VCSEL array chip 2 with the single VCSELs 5 in a hexagonal arrangement. FIG. 3*c* shows the arrangement of the rows 7 of micro lenses of the array which are also tilted with 30° or 60° to the corresponding side edges of the chip 2.

In a further embodiment the tilt angle $\beta$ is 45° for a VCSEL array with a quadratic array arrangement with the main axis being perpendicular to the chip axis as indicated in FIG. 4. This figure shows an example of a chip 2 with a quadratic array with rectangular VCSELs 5 arranged at 45° to the chip edges.

Figure 5:
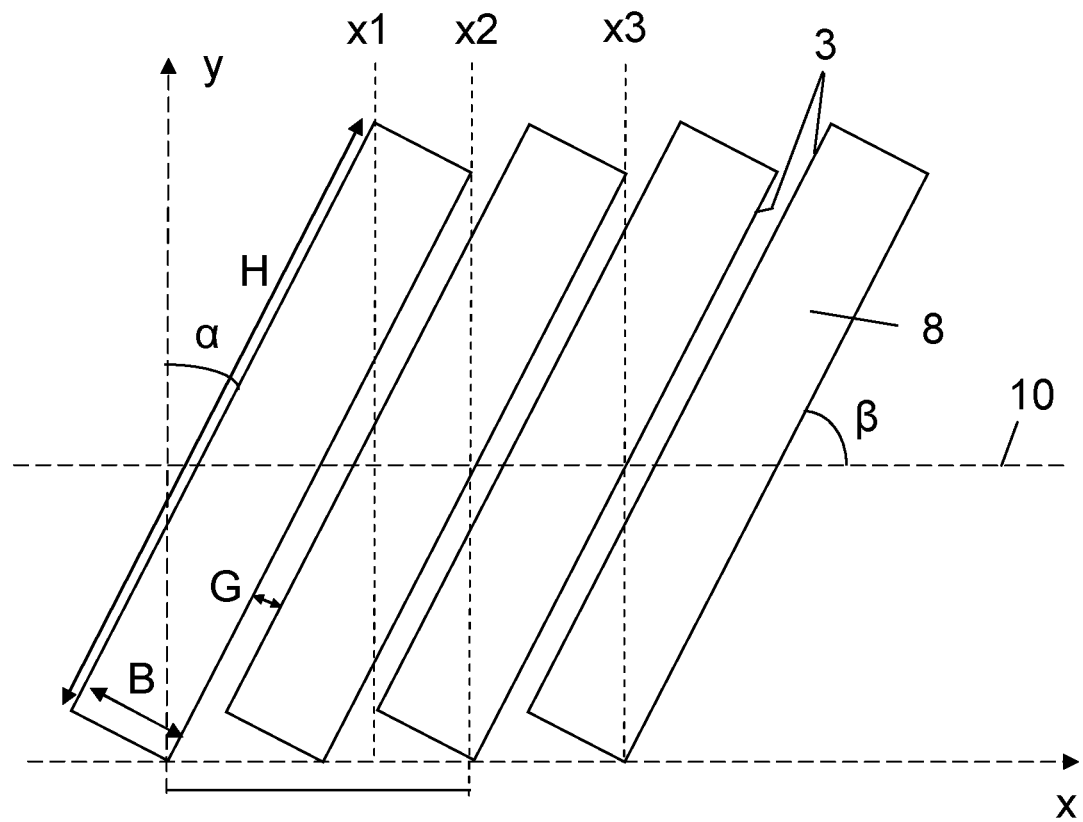
FIG. 5 a schematic view of an arrangement of several sub-modules according to the present invention.
Figure 5:
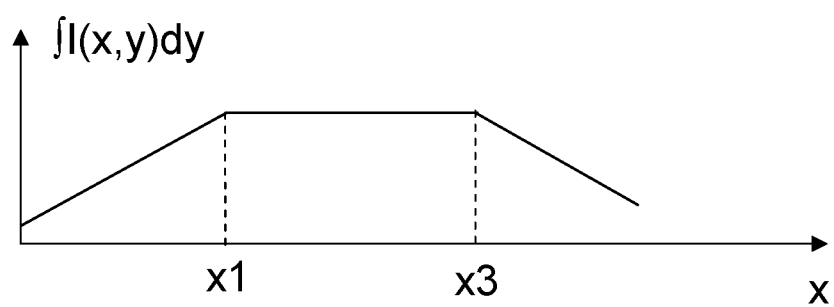

The tilt angle $\beta$ is preferably selected such that the gaps between the laser areas 8 or the sub-modules 1 are perfectly closed with respect to the projected laser line. Therefore, the condition $H \times \cos\beta = n \times (B+G)/\sin\beta$, with n being an integer number, has to be fulfilled as illustrated in FIG. 5. FIG. 5 shows the tilted arrangement of the surfaces or the sub-modules 1 in the laser module for n=2. The sub-modules 1 are arranged along a first axis 10 (parallel to the x-axis) and are tilted with their parallel side edges 3 against said first axis at an angle $\beta = 90° - \alpha$, $\alpha$ being the angle of the side edges 3 to the y-direction. For a fixed gap width G between the parallel side edges 3 of the surfaces of the sub-modules 1, which coincide with the laser areas 8 in this example, it is possible to find several solution sets $\{H, B, \beta\}$ within the other module requirements. For example: H influences also the power per unit length, $\beta$ is preferably 30°, 45° or 60° and so on. For the above condition the optical gaps in the laser line can be completely avoided. The homogeneity does not depend on the distance between the laser module and the working plane. The lower portion of FIG. 5 shows the integrated intensity distribution $\int I\,(x,y)\,dy$ of the laser line dependent on the position on the x-axis. The laser line is homogeneous for all positions x with the condition $x_1 \leq x \leq x_3$, wherein $x_1$ and $x_3$ are indicated in the above portion of the figure.

While the invention has been illustrated and described in detail in the drawings and forgoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. The features of all claims of the device can be freely combined. Any reference signs in the claims should not be construed as limiting the scope of the invention.

LIST OF REFERENCE NUMBERS

1 sub-module
2 VCSEL array chip
3 parallel side edges
4 VCSEL array with micro lens array
5 single VCSEL
6 main axis of hexagonal arrangement
7 rows of micro lenses
8 laser area
9 minima of intensity distribution
10 first axis

The invention claimed is:

1. A laser module comprising several sub-modules arranged along a first axis side by side on a common carrier, each of said sub-modules comprising a laser area formed of one or several arrays of semiconductor lasers on a surface of the sub-modules (1) and laser radiation emitted by said semiconductor lasers forming an intensity distribution in a working plane facing said surface of the sub-modules, wherein said sub-modules and laser areas are designed and arranged such that projections of the laser areas of adjacent sub-modules partly overlap in a direction perpendicular to said first axis, wherein said laser areas are formed of an arrangement of said arrays of semiconductor lasers, which comprises two parallel side edges, said parallel side edges of adjacent laser areas being parallel to one another and tilted by an angle $\beta$ to said first axis, wherein $0° < \beta < 90°$, wherein said laser areas are arranged to generate a homogeneous intensity distribution in the working plan in a direction parallel to the first axis by means of the tilted arrangement of the laser areas.

2. The laser module according to claim 1,
wherein said arrangement of said arrays of semiconductor lasers forms a rectangular area.

3. The laser module according to claim 2,
wherein said angle β is selected according to the condition: H×cos β=n×(B+G)/sin β, with n being any integer number, B being the width of the rectangular laser areas, H being the length of the rectangular laser areas and G being the width of a gap between the laser areas of adjacent sub-modules.

4. The laser module according to claim 1,
wherein said parallel side edges of said arrangement are tilted by an angle of β=45° to said first axis, said semiconductor lasers having rectangular or square shaped emission areas, side edges of which being oriented at an angle of 45° to said parallel side edges of said arrangement.

5. The laser module according to claim 1,
wherein said parallel side edges of said arrangement are tilted by an angle of β=30° or β=60° to said first axis, each array of semiconductor lasers comprising said semiconductor lasers in a hexagonal arrangement, a main axis of which is oriented parallel to said first axis.

6. The laser module according to claim 1,
wherein said sub-modules comprise individual microlenses and/or a single cylindrical lens in front of the semiconductor lasers, said microlenses and/or cylindrical lens being designed and arranged to collimate or focus the laser radiation emitted by said semiconductor lasers generating a laser line in the working plane, said laser line extending parallel to said first axis.

7. The laser module according to claim 1,
wherein said semiconductor lasers are VCSELs or VECSELs.

8. The laser module according to claim 1,
wherein said sub-modules and laser areas are designed and arranged such that at least in a central portion of the laser module covering several of said sub-modules a laser power of the laser radiation emitted by said semiconductor lasers when integrated in the direction perpendicular to the first axis coincides within an accuracy of ±10% for each portion of the first axis, said portion of the first axis being larger than a distance between adjacent semiconductor lasers and smaller than a gap between adjacent laser areas.

9. The laser module according to claim 1,
which is mounted in an apparatus moving an object surface in said working plane or said laser module perpendicular to said first axis.

\* \* \* \* \*